United States Patent [19]
Cooke et al.

[11] Patent Number: 5,677,634
[45] Date of Patent: Oct. 14, 1997

[54] APPARATUS FOR STRESS TESTING CAPACITIVE COMPONENTS

[75] Inventors: Peter A. Cooke, Escondido; David M. Ivancic, San Diego; Naom Chaplik, San Diego; Michael C. Steinmeyer, Oceanside; Chia-mu Chang; Vernon P. Cooke, both of Escondido, all of Calif.

[73] Assignee: Electro Scientific Industries, Inc., Portland, Oreg.

[21] Appl. No.: 559,547

[22] Filed: Nov. 16, 1995

[51] Int. Cl.$^6$ .................................................. G01R 31/12
[52] U.S. Cl. ........................... 324/548; 324/519; 324/678
[58] Field of Search ..................................... 324/519, 522, 324/546, 547, 548, 549, 629, 678

[56] References Cited

U.S. PATENT DOCUMENTS

| | | | |
|---|---|---|---|
| 3,268,809 | 8/1966 | Meyer et al. | 324/548 X |
| 3,414,792 | 12/1968 | Mui et al. | 324/548 X |
| 4,697,151 | 9/1987 | Butler | 324/123 R |
| 5,202,640 | 4/1993 | Schaaf et al. | 324/678 X |
| 5,510,719 | 4/1996 | Yamamoto | 324/548 |

FOREIGN PATENT DOCUMENTS

| | | | |
|---|---|---|---|
| 2903893 | 8/1980 | Germany | 324/548 |
| 96475 | 5/1986 | Japan | 324/548 |
| 209179 | 9/1991 | Japan | 324/548 |
| 6109792 | 4/1994 | Japan | 324/548 |

OTHER PUBLICATIONS

Young, "Leakage Testers For Small Capacitors", Electronic Components S0219-0042, pp. 1158-1160, Oct. 23, 1970.
Drummond-Murray, "Electrolytic Capacitor Tester", Wireless World, vol. 83, No. 1497, pp. 47-49, May 1977.

Primary Examiner—Ernest F. Karlsen
Assistant Examiner—Diep Do
Attorney, Agent, or Firm—Thomas J. Tighe

[57] ABSTRACT

A plurality of electrical circuit components having capacitance, e.g. ceramic capacitors, are tested simultaneously in a corresponding plurality of test channels. They are stressed by a variable voltage source that can produce an electrical potential selected from a wide range from low potential to high potential. For example the range of selectable potentials can be 1000 volts with a resolution of 1 volt. The charge current by which a component accumulates a charge is controlled to a selected linear rate by a current controller. Voltage sensors and current sensors measure accumulated charges and leakage current, respectively. The current sensor can be selectively sensitized to a plurality of anticipated leakage current ranges. In addition, the selected potentials can each be applied to the components in a single step or can be applied over time in ramp fashion. A processor can be used for running at least a prescribed test process on components, the processor being operatively coupled to, for controlling and receiving inputs from, the above elements. For example the processor is preferably coupled to the variable voltage source, the current controller, the voltage sensor, the current sensor, and a component discharge circuit, operatively coupled meaning that the processor controls.

18 Claims, 7 Drawing Sheets

APPARATUS FOR STRESS TESTING CAPACITIVE COMPONENTS

BACKGROUND OF THE INVENTION

This invention relates in general to apparatuses for stressing electrical circuit components having capacitance by applying an electrical potential across the components, and in particular to such apparatuses for testing the high potential characteristics of such components.

This invention can be used in many ways, but it is particularly useful in conducting what is commonly called "flash" tests of ceramic capacitors and the like. During a flash test a component is stressed by a high voltage, typically two or more times the component's voltage rating, for a very short time, e.g. 50 milliseconds (ms). Subsequently a low voltage is applied and leakage current is sensed to determine, among other things, whether the component has been damaged by the high voltage. This invention is advantageous over the prior art because it can perform both the flash test and the low voltage test, and has multiple test channels for simultaneous testing of multiple components. The electrical potential applied across the components can be selected from a wide range from low potential to high potential. For example the range of selectable potentials can be 0 to −1000 volts with a resolution of 1 volt. This invention also controls the current by which a component accumulates a charge. A current control holds the charge accumulation to a linear rate and the rate can be varied also over a wide range. The invention also includes sensors for measuring accumulated charges and leakage current. A leakage current sensor can be selectively sensitized to a plurality of anticipated leakage current ranges.

Other advantages and attributes of this invention will be readily discernable upon a reading of the text hereinafter.

SUMMARY OF THE INVENTION

An object of this invention is to provide a device for testing the high potential characteristics of components in a way more efficient than heretofore known in the prior art.

A further object of this invention is to provide such a device that has multiple test channels for simultaneous testing of multiple components.

A further object of this invention is to provide such a device that is capable of applying selected voltages over a wide range.

A further object of this invention is to provide such a device that includes a current controller that can be selectively set to provide constant charging current levels over a wide range.

A further object of this invention is to provide such a device that includes a current sensor which can be selectively sensitized for measuring leakage current over several magnitudes of low current ranges.

These objects, and other objects expressed or implied in this document, are accomplished by an apparatus for stressing electrical circuit components having capacitance. The apparatus includes means for selecting an electrical potential from a range of electrical potentials. The selected potential is applied across multiple test channels, preferably four, each containing a component to be tested. The potential is applied for a predetermined period of time to allow the components to accumulate an electrical charge. Preferably the magnitude of the selected potential can range from 0 volts to −1000 volts, although other ranges can be used without departing from the scope of this invention. The apparatus also includes means in each channel for allowing the components to accumulate a charge only at a selected constant rate, and means for measuring a charge acquired by the component at the end of the predetermined time. The apparatus can further include sensors for each channel for measuring leakage current through the components. Also, the current sensors can be selectively sensitized to match anticipated ranges of leakage current. In addition, the potential can be applied in a single step or can be applied over time in ramp fashion.

DESCRIPTION OF THE PREFERRED EMBODIMENT

Figure 1:
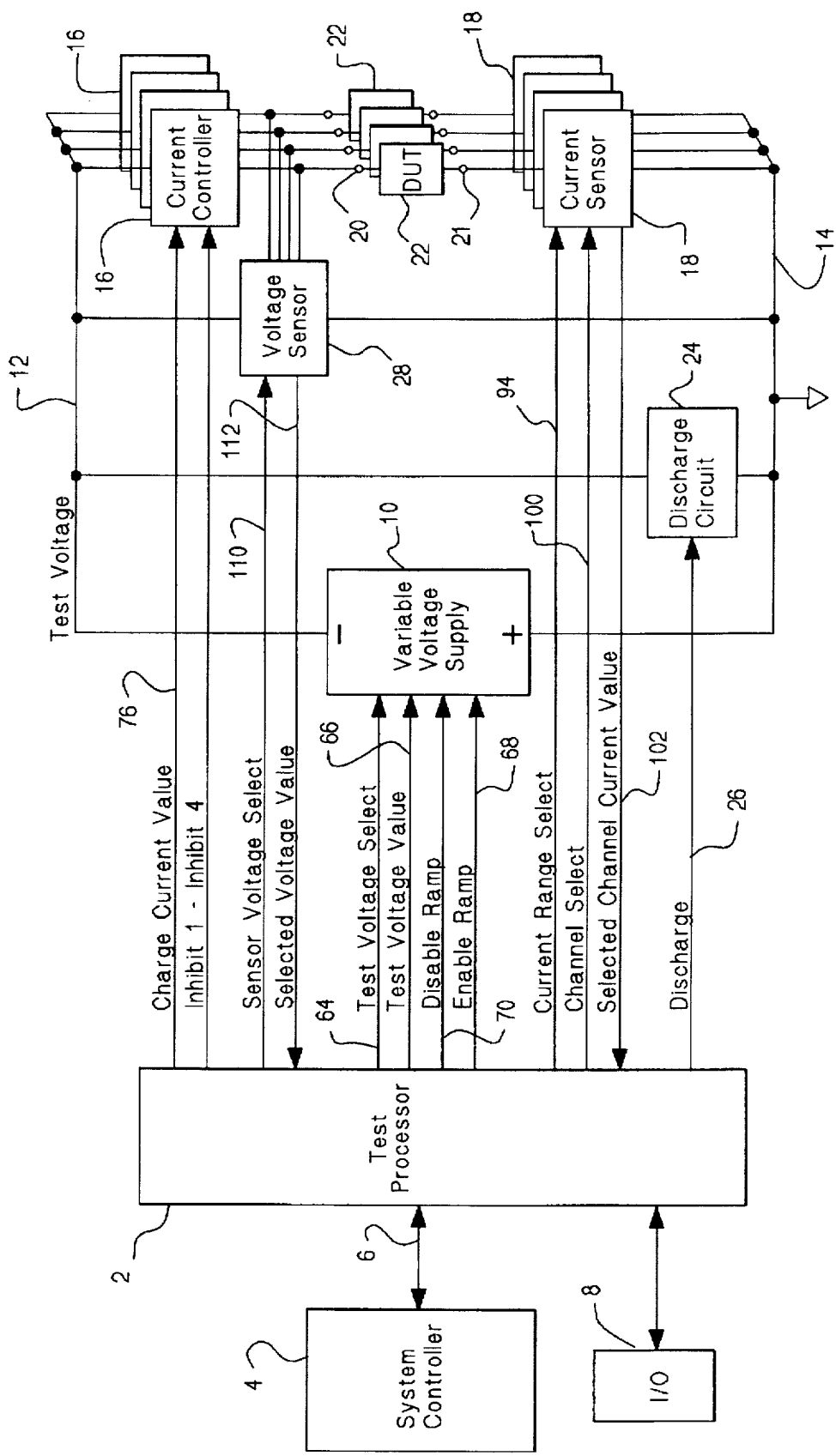
FIG. 1 is an overall functional block diagram of the invention.

Referring to FIG. 1, a test processor 2 is coupled to a system controller 4 via a two-way communications link 6. The system controller can be an operator or another processor, e.g. a higher level processor overseeing the operations conducted by the test processor, as in a hierarchical system. The communication link can be any conventional means of communication, for example an open computer bus, a serial data link. The test processor is preferably a preprogrammed microprocessor or microcomputer, and preferably includes the capability of coupling with conventional input/output devices 8, e.g. a serial communication channel. Also coupled to the processor is a variable voltage supply 10 which provides a selected test voltage 12 to be applied across components being tested. Preferably the supply has a range of essentially 0 v to −1000 v selectable by the processor in −1 v steps.

Referring again to FIG. 1, paralleled across the test voltage 12 line and circuit ground 14 are preferably four test channels, each channel having a current controller 16 connected to the test voltage line, a current sensor 18 connected to ground, and a pair of terminals, 20 and 21 for connecting a component, i.e. a device-under-test (DUT) 22, in between and in series with the current controller and the current sensor. Each current controller is coupled to the test processor and serves to provide a constant current at a level selected by the processor. A plurality of current levels within a range can be selected. Each current sensor is also coupled to the test processor and serves to sense the level of leakage current in its channel after a DUT in the channel has had the test voltage applied for a predetermined time, and make that information available to the test processor. Preferably the current controller can be selectively set to limit charging current from 1 to 50 milliamps (ma) in 1 ma steps. Preferably the current sensor can be selectively sensitized to detect current in the ranges of 1 to 1000 picoamps, 1 to 1000 nanoamps and 1 to 1000 microamps.

Referring again to FIG. 1, a discharge circuit 24 is also coupled to the test processor 2. This circuit provides a path for discharging the DUTs following testing. After each testing cycle is completed, the processor kills the test voltage, such as by programming it to substantially 0 v, and sends a discharge signal 26 to the discharge circuit. This signal causes the discharge circuit to provide a very low impedance path between the test voltage line and ground, thus providing a discharge path. Also coupled to the test processor is a voltage sensor 28 for sensing the individual voltages across the DUTs, and providing that information to the processor. The voltage levels across the DUT's are sensed after the test voltage is killed, but before the DUT's are discharged. Preferably the voltage sensor is also capable of sensing the test voltage so that the processor can be assured that the selected test voltage was actually applied across the DUTs.

Figure 2:
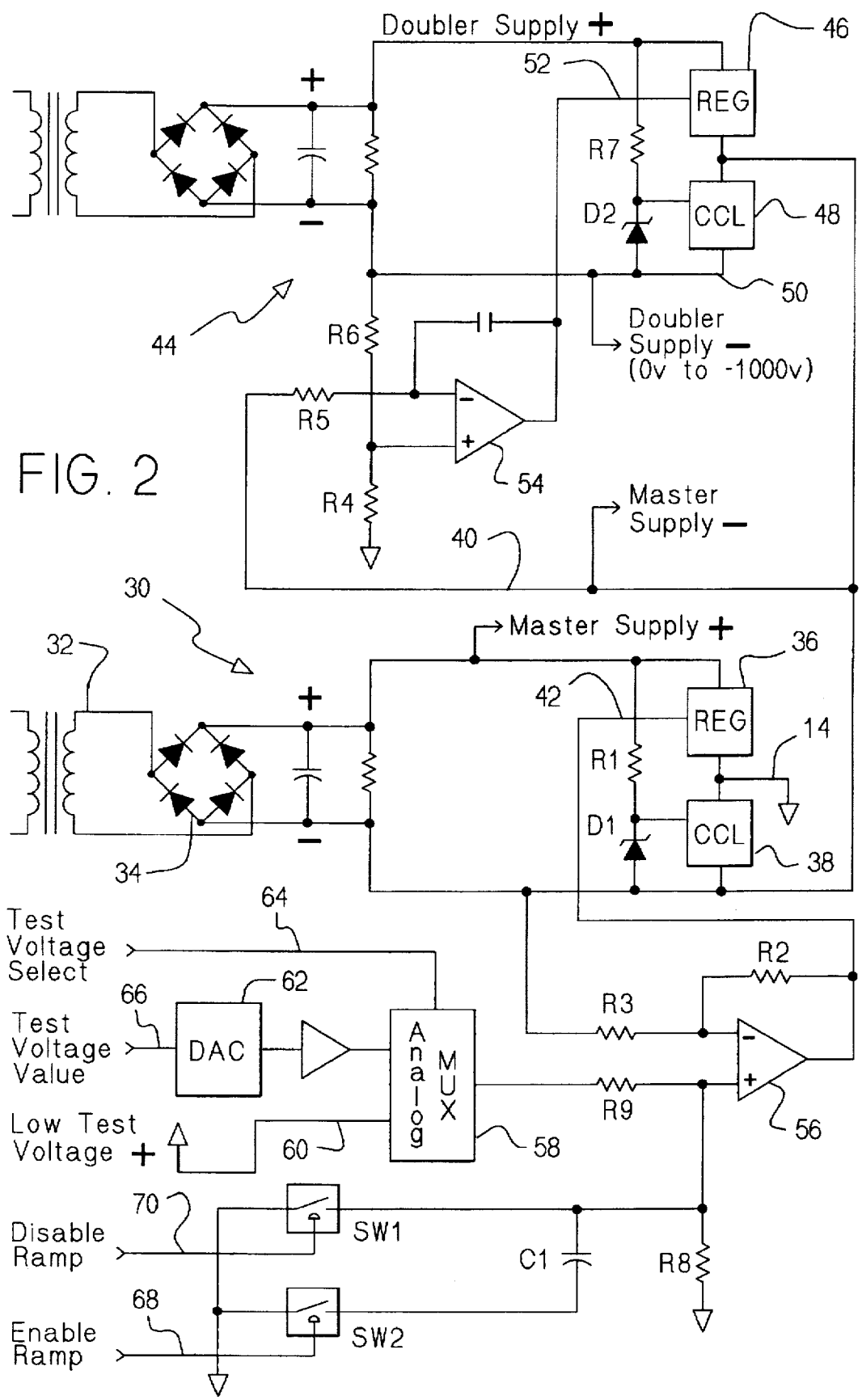
FIG. 2 is a functional diagram of a variable voltage supply according to this invention.

Referring to FIG. 2, the variable voltage supply 10 (FIG. 1) is shown in further detail. A master supply, generally designated 30, is illustrated to draw power from the secondary 32 of a transformer which is preferably a step-up transformer providing preferably about 600 v RMS across the secondary when the primary is connected to standard line voltage, i.e. 110 v AC. The secondary is coupled to a fullwave rectifier 34 the outputs of which are coupled across a series network comprising a regulator (REG) 36 and a constant current load (CCL) 38, the former being connected to the positive output (Master Supply+) of the rectifier, and the latter being connected to the negative output (Master Supply−) of the rectifier. The junction of the REG and the CCL is referenced to circuit ground 14. In parallel with the series network is a resistor R1 in series with a zener diode D1 the anode of which is connected to the negative output of the rectifier. The magnitude of Master Supply− 40 is controlled by the signal on the input 42 of the REG 36. As will be explained, the Master Supply− voltage is preferably ½ the selected test voltage.

Referring again to FIG. 2, a doubler supply, generally designated 44, is identical to the master supply except that the junction between its REG 46 and CCL 48 is referenced to the Master Supply− 40 voltage from the master supply. Being thus referenced the negative output 50 (Doubler Supply−) from the doubler supply rides on the negative output of the master supply. The magnitude of the Doubler Supply− voltage is controlled by the signal present at the input 52 of the REG 46. Coupled to the input 52 is the output of an operational amplifier 54. The non-inverting input of the amplifier is centrally coupled to a voltage divider consisting of R4 and R6 which are preferably of equal resistance, the divider being coupled between Doubler Supply− voltage and circuit ground. So the signal at the non-inverting input is half of Doubler Supply−. The signal at the inverting input is the Master Supply− voltage 40 from the master supply. Any time Doubler Supply− is not twice that of Master Supply−, the difference is felt at the REG 46 and the REG adjusts to Doubler Supply− voltage to eliminate the difference.

Referring to FIGS. 1 and 2, the input 42 of the master supply regulator 36 is shown to be coupled to the output of an operational amplifier 56, the inverting input of which is coupled to the Master Supply− voltage through input resistor R3. The non-inverting input of the amplifier is coupled to the output of an analog multiplexer 58 through input resistor R9. The multiplexer receives two inputs, one input being preferably a fixed, low test voltage (Low Test Voltage+) 60, the other input coming from the output of a digital-to-analog converter (DAC) 62. The selection of which of the multiplexer's inputs is coupled to its output is controlled by a signal (Test Voltage Select) 64 from the test processor 2. The input to the DAC is a test voltage digital value 66 also from the test processor. Preferably the DAC is at least a 10-bit converter to provide a resolution of 1/1024 in order to provide a test voltage resolution of −1 volt over a 0 v to −1000 v volt range. The test voltage value is correspondingly a 10-bit digital word from the test processor. The test voltage select signal 64 can be one or more digital bits from the test processor depending on the how the analog multiplexer is implemented. In operation, either a voltage corresponding to a test voltage value or the Low Test Voltage+ is applied to the amplifier 56 which provides gain according to its resistor configuration, and the output of the amplifier drives the regulator 36 to cause the Master Supply− voltage level to correspond to ½ the selected test voltage.

Referring again to FIGS. 1 and 2, the selected test voltage can be applied to the DUT's either in step fashion or in ramp fashion. Also coupled to the non-inverting input of amplifier 56, directly, is a ramp circuit having a capacitor C1 and two single pole, single throw switches SW1 and SW2. To cause the Master Supply+ voltage to ramp down to a selected value, the capacitor is coupled to circuit ground by closing the contacts of SW2. The contacts are closed by a signal (Enable Ramp) 68 from the test processor. With C1 coupled to ground, the non-inverting input of the amplifier does not rise immediately to the voltage output the analog MUX, but rather rises to that level over a period of time depending on the charge time of R9 and C1. The processor can subsequently discharge C1 by closing the contacts of SW1 which closure effectively shorts the terminals of C1 and therefore provides a discharge path. SW1 is closed by a signal (Disable Ramp) 70 from the test processor.

Figure 3:
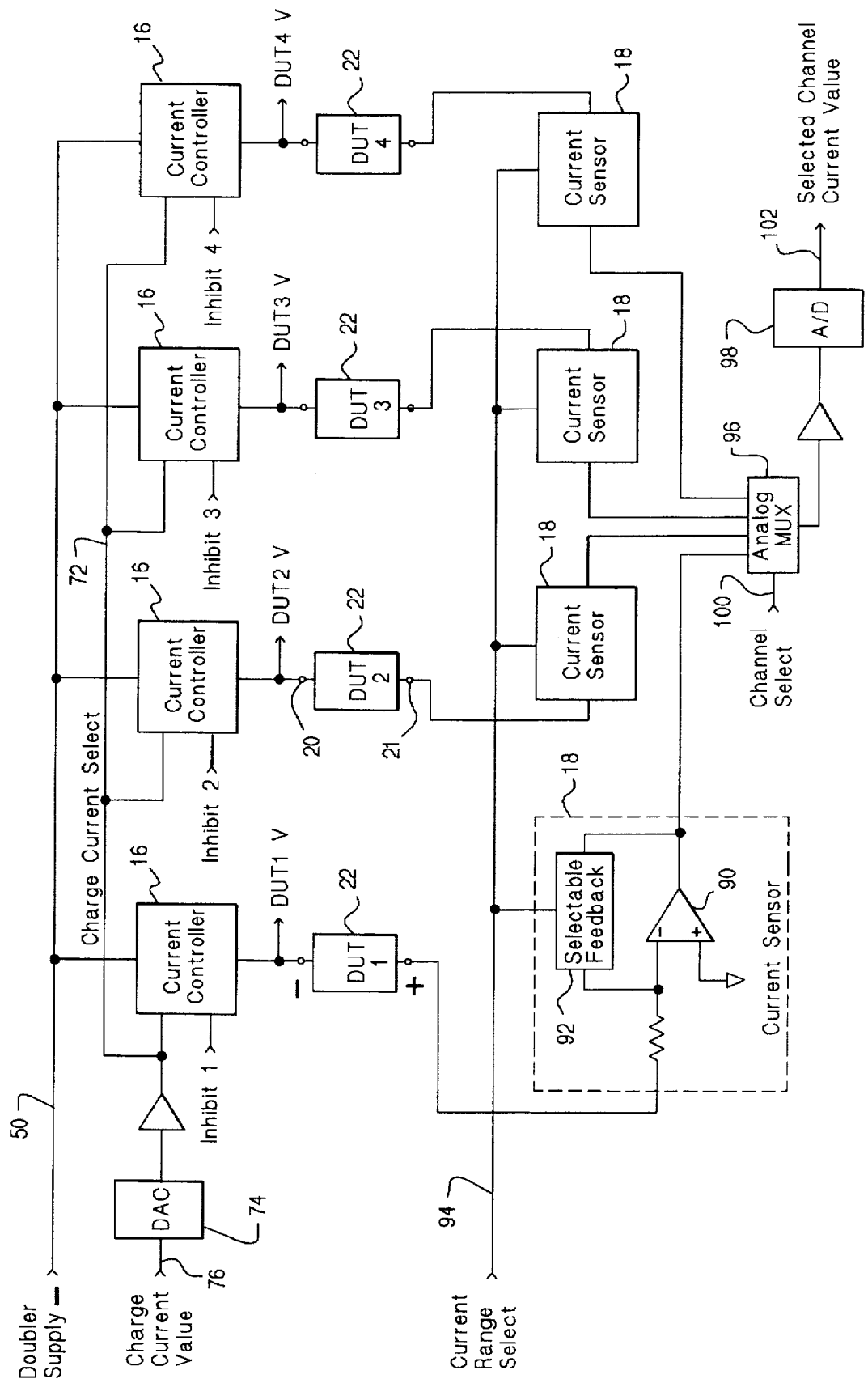
FIG. 3 is a functional diagram of current controlling and current sensing functions according to this invention.
Figure 7:
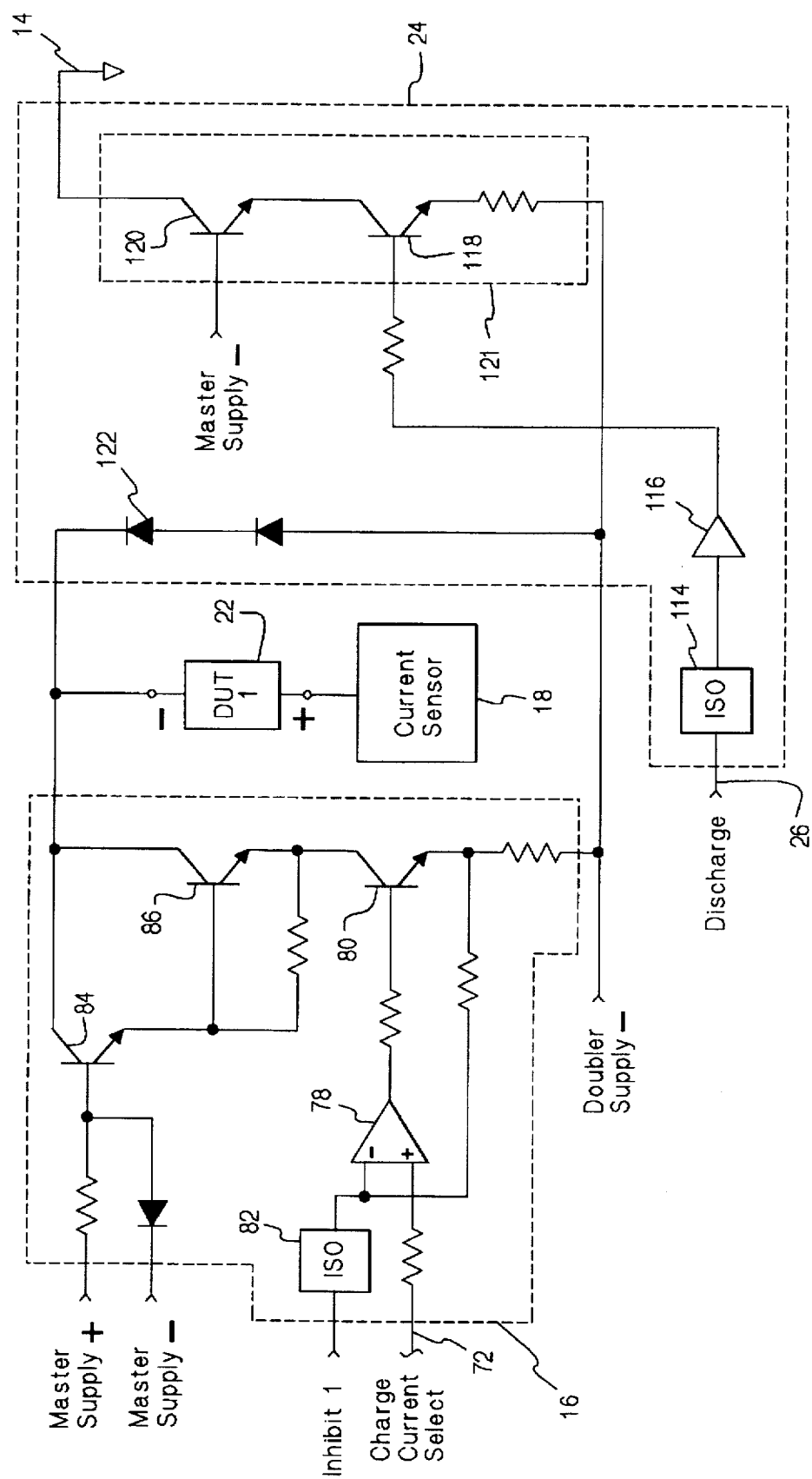
FIG. 7 is a more detailed functional diagram of a current limiter and a discharge circuit according to this invention.

Referring to FIGS. 3 and 7, the four test channels are illustrated in more detail. The current controllers 16 of each channel are connected in series between the selected test voltage− (Doubler Supply−) and the DUTs 22. The current controllers are controlled preferably by an analog signal (Current Limit Select) 72 which is derived from the output of a DAC 74, the output of which is determined by a digital, current limit value 76 from the test processor 2. Preferably the DAC 74 is a 10-bit DAC. In this embodiment the resolution of the current controllers is about 1 ma which requires only a 6-bit DAC but the extra bits of resolution can be used to adjust the linearity through software. Each current controller preferably includes an amplifier 78 which controls the conductance of a transistor amplifier 80. As illustrated, the amplifier 78 is an operational amplifier, the non-inverting input of which is coupled to the Current Limit Select signal which, determines the bias level at the base of the transistor 80. The inverting input of the amplifier is coupled to an inhibit signal (Inhibit 1) through an optical isolator amplifier 82. The inhibit signal comes from the test processor 2. When the inhibit signal is true, the signal at the inverting input of amplifier 78 causes the base of transistor 80 to be biased into cutoff, thereby stopping all current, except for leakage current, through the current controller. The inhibit signals can be used by the processor to cut off current channels in which a DUT is missing. The collector circuit of transistor 80 is coupled to a current amplifier circuit, including darlington coupled transistors 84 and 86. The current amplification reduces the power rating requirements of the base circuit of transistor 84. Since the base of transistor 84 is biased at one diode voltage drop away from Master Supply− and the magnitude of Master Supply− is always half the magnitude of Doubler Supply−, the test voltage is always essentially divided equally between the two transistors, 80 and 86. This division reduces by half the power ratings required for the current control amplifier.

Figure 8:
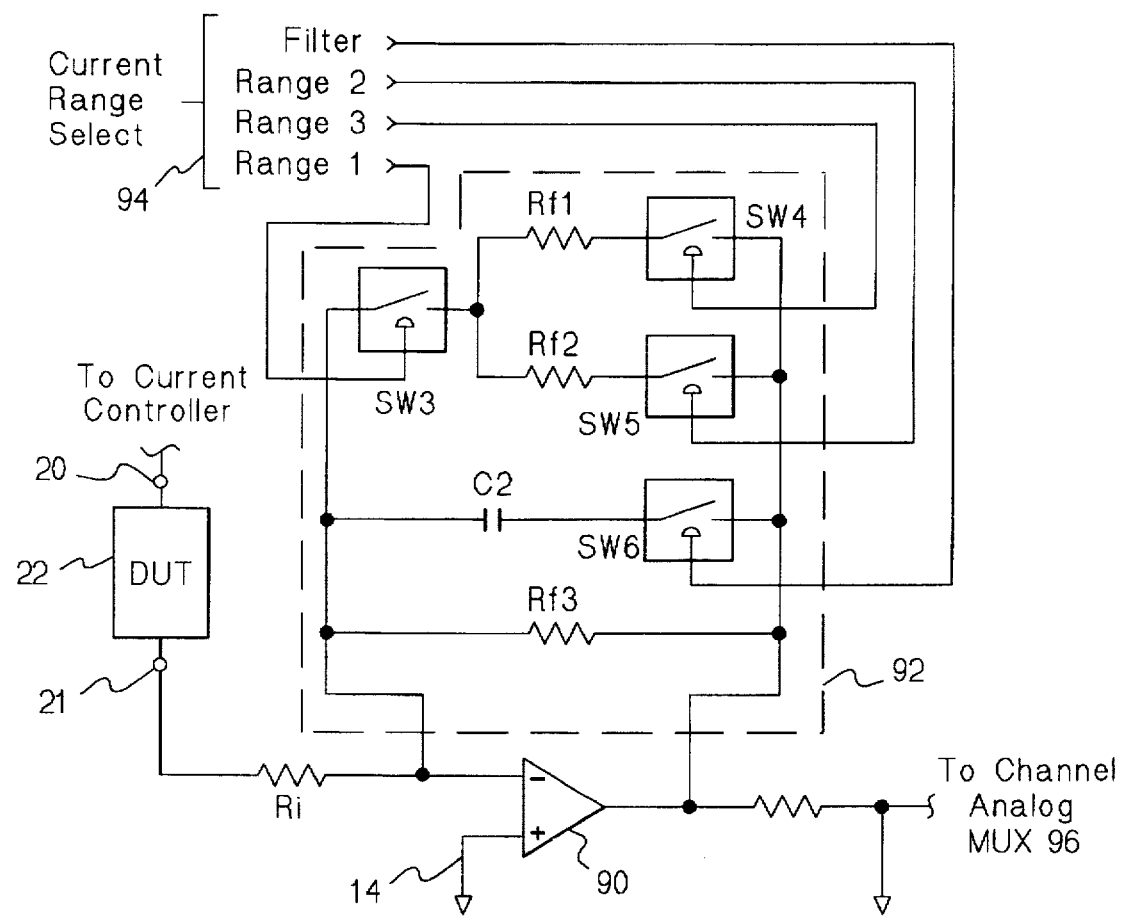
FIG. 8 is a more detailed functional diagram of a current sensor according to this invention.

Referring to FIGS. 3 and 8, the current sensors 18 are illustrated to preferably include an operational amplifier 90, the non-inverting input of which is coupled to circuit ground. The inverting input of the amplifier is coupled to terminal 21 of the DUT 22 and to a negative feedback circuit 92 in which the impedance of the feedback is selectable by the test processor 2. In operation, the value of the feedback determines the current sensing range. The feedback is selected by a plurality of signals (Current Range Select) 94 from the test processor. These signals are shown in detail in FIG. 8 to be three range signals and a filter signal all of which control, one each, a plurality of single pole, single throw switches, SW3–SW6. With all the switches open, the feedback consists only of resistor Rf3 which preferably is the highest gain configuration. For example, resistor Ri can be approximately 4K ohms and Rf3 can be on the order of 500M ohms providing a gain of approximately 100,000. When signals Range 1 and Range 2 are true, the feedback consists of resistor Rf2 in parallel with resistor Rf3. Preferably Rf2 is 100 times lower in magnitude than Rf3, which in the example would effectively reduce the gain to approximately 1000. When Range 1 is true and Range 3 is true, the feedback consists of resistor Rf1 in parallel with Rf3. Preferably Rf1 is five orders of magnitude less than Rf3, which in the example would then reduce the gain to approximately 1. In this example, the sensor amplifier 90 has three current ranges based on selectable gains of about 1, 1000 and 100,000. SW6 also allows a capacitor to be placed in parallel with the resistive feedback when the filter signal is true. This allows the processor to selectively include a high frequency by-pass in the feedback circuit.

Referring to FIG. 8, the switches SW3–SW6 are preferably implemented using single-pole, single-throw CMOS analog switches—for example, DG411 quad switches. Since CMOS switches produce some leakage current themselves and the configuration where only Rf3 is in the feedback is intended to sensor current in the 1 to 1000 pa range, SW3 is used to further isolate the paths Rf1/SW4 and Rf2/SW5 from the feedback circuit. Since SW4 and SW5 are in parallel their leakage currents are additive, but SW3 cuts off the leakage current produced by SW4 and SW5, and effectively reduces the leakage current through those two paths by about one half. Also, preferably the inverting input of amplifier 90 is connected to the drain of SW3 and the output of the amplifier is connected to the sources of SW4–SW6. These connections further reduce leakage current feedback because electronic switches are not symmetrical and in DG411s the drain leakage current is measurably less than the source leakage current. In embodiments using other types of electronic switches, any asymmetry of leakage current should be considered in arranging connections with the amplifier.

Referring to FIG. 3, the output of each current sensor amplifier is coupled to an input, one each, of an analog multiplexer 96, the output of which is coupled to an analog-to-digital converter (A/D) 98. The selection of which multiplexer input gets coupled to the output is controlled by a channel select signal 100 which is preferably a plurality of digital signals of sufficient width to individually select four inputs. The channel select signal comes from the test processor 2. The output of the A/D 98 is a signal (Selected Channel Current Value) 102 which is communicated back to the test processor. Preferably the A/D provides a 10-bit output (Selected Channel Current Value) which corresponding to the current value of the selected channel.

Figure 4:
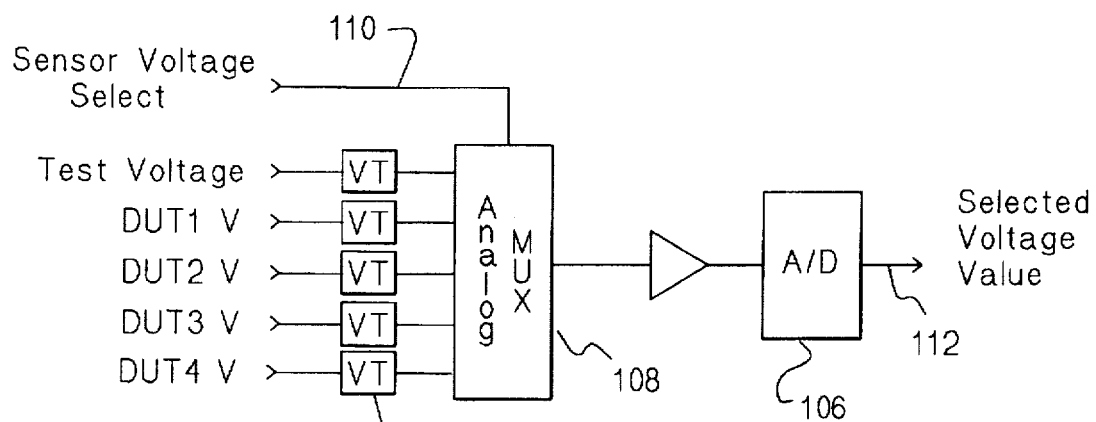
FIG. 4 is a functional diagram of a voltage monitoring circuit for providing voltage level information from certain locations to a processor, according to this invention.

Referring to FIGS. 3 and 4, the voltages to which the DUTs charge over a predetermined time is communicated back to the test processor by the voltage sensing circuit 28 which includes a plurality of voltage translators (VT) 104 for translating the voltages to a level usable by an analog-to-digital converter 106. The outputs of the voltage translators are coupled individually to inputs of an analog multiplexer 108 the output of which is coupled to the input of the A/D. The analog multiplexer is controlled by a plurality of digital signals (Sensor Voltage Select) 110 from the test processor, and the output of the A/D is at least 10 digital data bits (Selected Voltage Value) 112 that are communicated to the test processor.

Referring to FIGS. 3 and 7, the charge path for a DUT in a channel is, positive to negative, from a virtual ground at the inverting input of a current sensor amplifier 90 through the DUT, and through a current controller to the Doubler Supply− voltage. The plus and minus signs illustrated near the DUTs indicate the polarity of the charges imparted in the DUTs during the charging phase of testing. To discharge the DUTs, the processor removes the test voltage and communicates the discharge signal 26 to the discharge circuit 24 shown in greater detail in FIG. 7. The discharge signal is communicated to an optical isolator amplifier 114 and through a current amplifier 116 to enable a very low impedance circuit 121 comprising two transistor amplifiers, 118 and 120. The signal is fed to the base of transistor amplifier 118 of which the collector circuit is coupled through transistor amplifier 120 to circuit ground. The Master Supply− voltage provides forward biasing for transistor 120 and the discharge signal causes the transistor 118 to be forward biased. When this occurs, it opens a discharge path from circuit ground through the two transistors, through a series diode network 122 and through the DUT back to the virtual ground at current sensor amplifier 90. Since the magnitude of Master Supply− is always half that of Doubler Supply− and since Master Supply− is applied to the base of transistor 120, the test voltage being discharged is essentially divided equally between transistors 120 and 118. This significantly reduces the power rating requirements of the discharge circuit. Preferably, the very low impedance circuit 121 comprises a plurality of parallel identical transistor amplifier circuits as described to minimize the impedance path through them to circuit ground.

Figure 6:
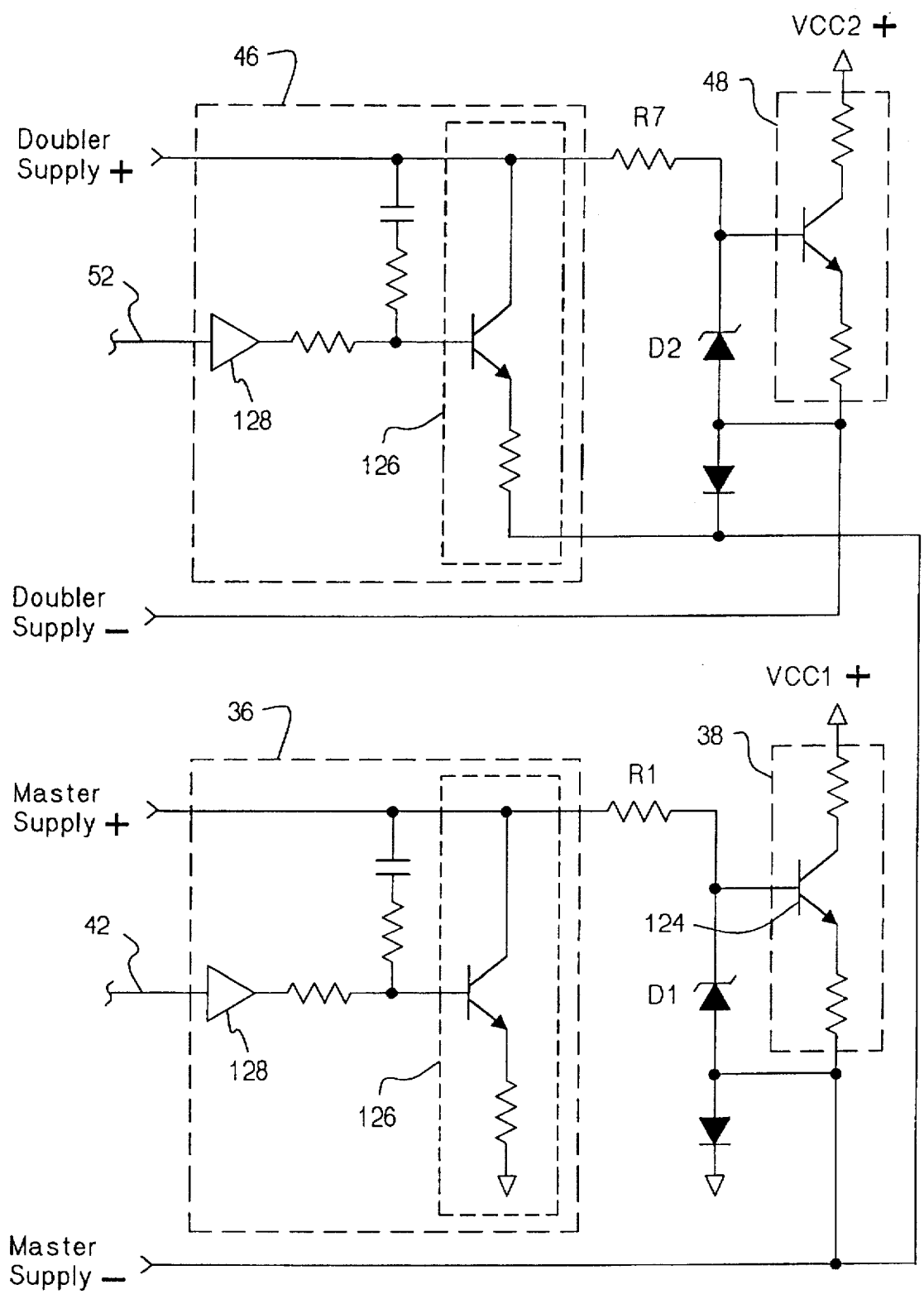
FIG. 6 is a more detailed functional diagram of certain portions of the variable voltage supply.

Referring to FIGS. 2 and 6, the constant current load 38 of the master supply is illustrated to preferably include a transistor amplifier 124 the base of which is tied between R1 and D1. D1 provides a constant bias on the base causing the current through the transistor to be constant. This constant current load insures that the master supply operates in a linear region. The constant current load 48 of the doubler supply is preferably identical in components and configuration. The master supply regulator 36 is illustrated to be a transistor amplifier 126 the base of which is driven by a current amplifier 128. The transistor amplifier 126 is operated in its linear region and in operation determines the impedance between circuit ground and Master Supply+. In order to maximize, negatively, Master Supply−, the transistor circuit 126 is into maximum conductance thereby presenting a very low impedance between circuit ground and Master Supply+. In order to drive Master Supply− to essentially 0 v, the transistor amplifier 126 is biased to present minimum conductance between circuit ground and Master Supply+. Preferably, the regulator amplifier 36 is a plurality of such transistor amplifiers in parallel in order to minimize the impedance between ground and Master Supply+ when it is desired to maximize Master Supply−.

Figure 5:
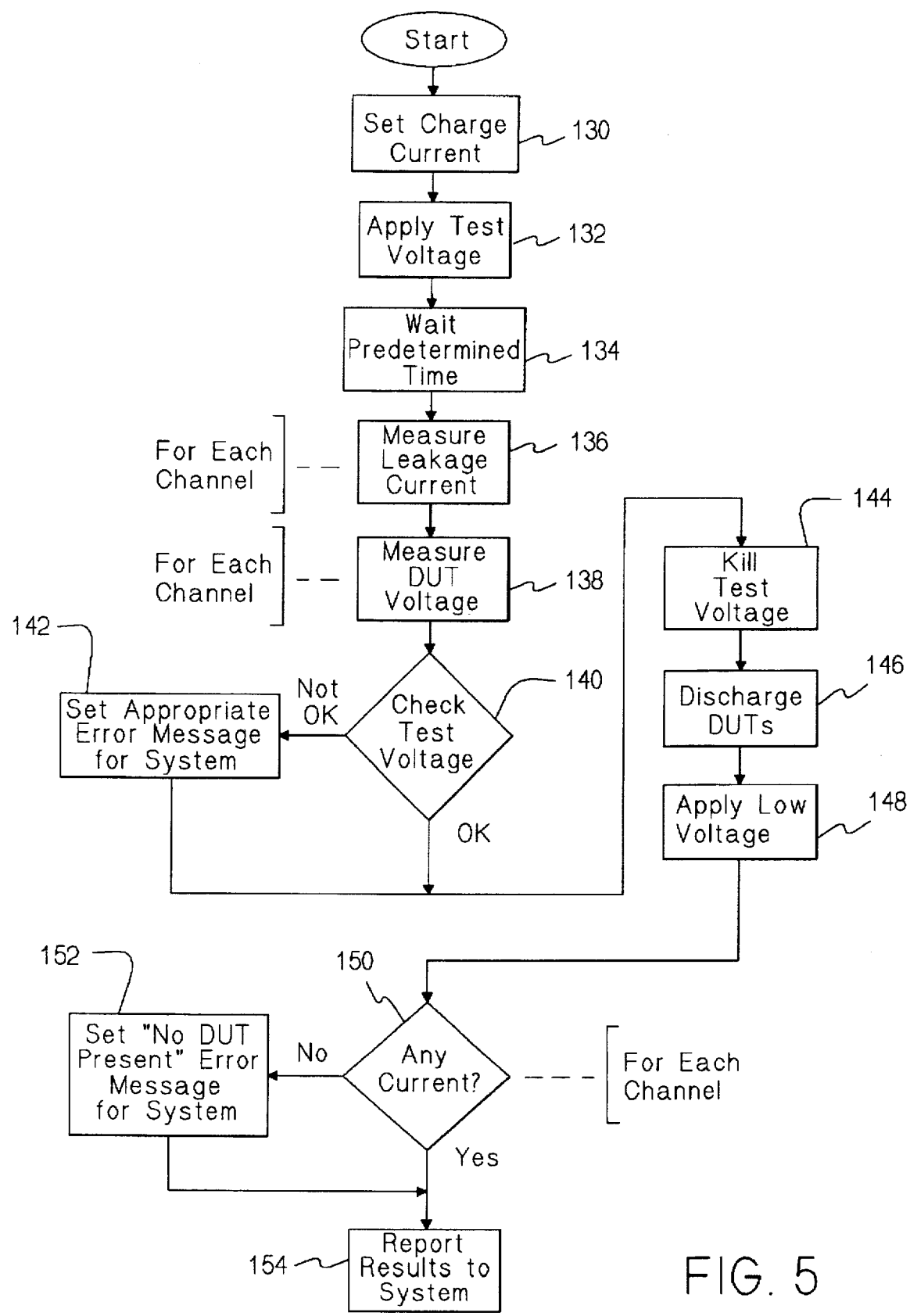
FIG. 5 is a flow diagram of a preferred test process according to this invention.

Referring to FIG. 5, a preferred process which is preprogrammed into the test processor is illustrated. The process starts when the charge current level is set 130 by the test processor, and the test voltage is set and applied 132 to the DUTs by the test processor. The values for setting the charge current level and the test voltage level are communicated beforehand to the test processor by the system controller. After applying the test voltage, the test processor waits 134 a predetermined time, for example by entering a timing loop, waiting for the DUTs to be affected by the test voltage in an anticipated fashion. For example, if the DUTs are capacitors, the time that the processor waits is the time necessary for the capacitors to charge to the test voltage taking into consideration the constant charging current setting of the current controllers.

After waiting the predetermined time, the leakage current in each channel is measured 136 by the test processor via the channels' respective current sensors. Prior to measuring the leakage current, the test processor sets the current range for the current sensors to match an anticipated range of leakage current. The range setting information is also sent by the system controller and is dependent on the type of components being tested. Either before, after or concurrently with measuring the leakage current, the voltage across each DUT with reference to circuit ground is measured 138 by the test processor. This insures that the test voltage has had the proper effect on the DUTs. For example, if the DUTs are capacitors, this is a means by which the test processor ensures that each capacitor actually did charge to the test voltage level.

The test voltage is then checked 140 by the test processor to ensure that it corresponds to the test voltage value communicated by the test processor to the variable voltage supply. If it does not correspond, then an appropriate error message is set in an error memory for subsequent communication to the system controller. In either case, the test voltage is disabled 144, and the DUTs are discharged 146. Following this, the low test voltage is applied 148 to determine whether each channel had a DUT in place during the test, and also to determine whether the higher test voltage destroyed one or more DUTs in the channels. Following application of the low test voltage, the current sensors are once again read 150 by the test processor to see if there is any significant leakage current whatsoever through each of the channels. If there is no significant current detected in a channel, an appropriate error message (e.g. "No DUT Present") is stored 152 in error memory pertaining to that channel. Following these operations, the results including the information stored in error memory are reported 154 to the system controller. The low voltage test for determining the presence of a DUT, step 148–154, can also be performed at the beginning of the process, for example before applying the test voltage, step 132.

The foregoing description and drawings were given for illustrative purposes only, it being understood that the invention is not limited to the embodiments disclosed, but is intended to embrace any and all alternatives, equivalents, modifications and rearrangements of elements falling within the scope of the invention as defined by the following claims.

I claim:

1. For a component having electrical capacitance, an apparatus for electrical stress testing the component comprising:

(a) means for selecting an electrical potential from a range of electrical potentials, (b) means for applying, for a predetermined time period, the selected electrical potential across the component to urge it to accumulate an electrical charge, (c) means for limiting the accumulation of the charge to a selected rate, and (d) means for measuring a charge acquired by the component at the end of the predetermined time.

2. The apparatus according to claim 1 further comprising means for measuring leakage current through the component.

3. The apparatus according to claim 2 wherein the means for measuring leakage current can be selectively sensitized to detect current over a plurality of ranges.

4. The apparatus according to claim 1 wherein the means for limiting the accumulation of the charge comprises:

(a) means for selecting a current level from a range of current levels, and (b) means for limiting current to and from the component to the selected level.

5. The apparatus according to claim 2 wherein the means for limiting the accumulation of the charge comprises:

(a) means for selecting a current level from a range of current levels, and (b) means for limiting current to and from the component to the selected level.

6. The apparatus according to claim 1 further comprising:

(a) a processing means for running at least a prescribed test process on a component, the processing means being operatively coupled to the means for selecting an electrical potential, the means for measuring a charge acquired by the component, and the means for limiting the accumulation of the charge, and (b) means, operatively coupled to the processing means, for measuring leakage current in the series circuit.

7. The apparatus according to claim 6 further comprising means, operatively coupled to the processing means, for discharging the component.

8. The apparatus according to claim 1 further comprising means for selectively applying the selected potential in step fashion or in ramp fashion.

9. For a plurality of components having electrical capacitance, an apparatus for electrical stress testing the components comprising:

(a) means for selecting an electrical potential from a range of electrical potentials, (b) means for applying, for a predetermined time period, the selected electrical potential across each component to urge said each component to accumulate a respective electrical charge, (c) means for limiting the accumulation of the respective charges to a selected rate, and (d) means for measuring the respective charges acquired by the components at the end of the predetermined time.

10. The apparatus according to claim 9 further comprising a plurality of current sensors, one coupled to each component, for measuring respective leakage currents through the components.

11. The apparatus according to claim 10 wherein the current sensors can be selectively sensitized to detect current over a plurality of ranges.

12. The apparatus according to claim 9 wherein the means for limiting the accumulation of the respective charges comprises:

(a) means for selecting a current level from a range of current levels, and (b) means, coupled to each component, for limiting current to and from said each component to the selected level.

13. The apparatus according to claim 10 wherein the means for limiting the accumulation of the respective charges comprises:

(a) means for selecting a current level from a range of current levels, and (b) means, coupled to each component, for limiting current to and from said each component to the selected level.

14. The apparatus according to claim 9 further comprising:

(a) a processing means for running at least a prescribed test process on components, the processing means being operatively coupled to the means for selecting an electrical potential, the means for measuring charges acquired by the components, and the means for limiting the accumulation of the respective charges, and (b) means, operatively coupled to the processing means, for measuring respective leakage currents through the components.

15. The apparatus according to claim 14 further comprising means, operatively coupled to the processing means, for discharging the components.

16. The apparatus according to claim 9 further comprising means for selectively applying the selected potential in step fashion or in ramp fashion.

17. For a processor, a process for electrical stress testing a component having capacitance comprising the steps:

(a) selecting a current limit and programming a current controller, coupled in series with the component, to limit charge current to and from the component to the selected limit, (b) selecting a stress potential, (c) programming a variable voltage supply, coupled across the component, to apply the selected stress potential across the component, (d) waiting a predetermined time, (e) measuring leakage current through the component, (f) measuring a charge accumulated by the component, (g) removing the stress potential from across the component, (h) discharging the component, (i) applying a potential across the component sufficient to determine whether the component has been rendered inoperative by the stress potential, (j) measuring for any leakage current, and (k) if there is no leakage current then providing a corresponding error indication to the processor.

18. The process according to claim 17 further comprising the steps:

(a) checking the stress potential being applied across the component to determine if it matches the selected stress potential, and (b) if it is not, then providing a corresponding error indication to the processor.

* * * * *

UNITED STATES PATENT AND TRADEMARK OFFICE
CERTIFICATE OF CORRECTION

PATENT NO. : 5,677,634
DATED : October 14, 1997
INVENTOR(S) : Peter A. Cook, et al.

It is certified that error appears in the above-identified patent and that said Letters Patent is hereby corrected as shown below:

In column 4, line 29, please add the word --of-- after the word "output".

In column 4, lines 41 and 51, please delete the words "Current Limit" and replace with the words --Charge Current--.

In column 6, lines 1 and 2, please replace "correspond-ing" with --corresponds--.

Signed and Sealed this

Twenty-seventh Day of January, 1998

Attest:

BRUCE LEHMAN

Attesting Officer

Commissioner of Patents and Trademarks